(12) United States Patent
Charlon et al.

(10) Patent No.: US 9,124,225 B2
(45) Date of Patent: Sep. 1, 2015

(54) DUAL POWER AMPLIFIER LINEARIZER

(71) Applicant: Scintera Networks LLC, Wilmington, DE (US)

(72) Inventors: Olivier Charlon, San Francisco, CA (US); Frédéric Roger, Santa Clara, CA (US); Michael Chapman, San Francisco, CA (US)

(73) Assignee: SCINTERA NETWORKS LLC, Wilmington, DE (US)

( * ) Notice: Subject to any disclaimer, the term of this patent is extended or adjusted under 35 U.S.C. 154(b) by 0 days.

(21) Appl. No.: 14/192,488

(22) Filed: Feb. 27, 2014

(65) Prior Publication Data

US 2015/0061762 A1    Mar. 5, 2015

Related U.S. Application Data

(60) Provisional application No. 61/873,488, filed on Sep. 4, 2013.

(51) Int. Cl.
| | |
|---|---|
| *H03F 1/32* | (2006.01) |
| *H03F 3/24* | (2006.01) |
| *H03F 3/189* | (2006.01) |
| *H03F 3/68* | (2006.01) |

(52) U.S. Cl.
CPC ............. *H03F 1/3258* (2013.01); *H03F 3/189* (2013.01); *H03F 3/24* (2013.01); *H03F 3/68* (2013.01); *H03F 2200/451* (2013.01)

(58) Field of Classification Search
USPC .................. 330/149, 295, 124 R, 53, 84, 286
See application file for complete search history.

(56) References Cited

U.S. PATENT DOCUMENTS

| | | | | |
|---|---|---|---|---|
| 6,897,721 | B2 * | 5/2005 | Hellberg ........................ | 330/149 |
| 7,541,866 | B2 * | 6/2009 | Bowles et al. ............. | 330/124 R |
| 7,953,378 | B2 * | 5/2011 | Saed ............................ | 455/114.3 |
| 8,248,160 | B2 * | 8/2012 | Saed ............................ | 330/149 |

* cited by examiner

*Primary Examiner* — Hieu Nguyen (57) ABSTRACT

A circuit in a transmitter with multiple power amplifiers includes multiple individual linearizer circuits each receiving a corresponding input signal and each providing a conditioned input signal to a corresponding power amplifier. The linearizer circuit each include: (a) a pre-distortion circuit receiving (i) the corresponding input signal and (ii) the output signal of a corresponding power amplifier, and providing a pre-distortion signal; (b) a cancelation circuit receiving an interfering signal and providing a cancelation signal; and (c) a combination circuit that combines the cancelation signal and the pre-distortion signal to provide a conditioned input signal to the corresponding power amplifier.

11 Claims, 9 Drawing Sheets

DUAL POWER AMPLIFIER LINEARIZER

CROSS REFERENCE TO RELATED APPLICATIONS

The present application relates to and claims priority of U.S. provisional patent application ("Copending Provisional Application"), Ser. No. 61/873,488, entitled "Dual Power Amplifier Linearizer," filed on Sep. 4, 2013. The disclosure of the Provisional Patent Application is hereby incorporated by reference in its entirety.

BACKGROUND OF THE INVENTION

1. Field of the Invention

The present invention relates to linearization of power amplifiers. In particular, the present invention relates to linearization of power amplifiers in a multi-path transmitter.

2. Discussion of the Related Art

To facilitate deployment and to reduce operating expense, small cells in a cellular communication system must be highly efficient (e.g., have a small form factor and be low-power). With high efficiency, the size, the weight and the cost of components, heat sinks, power supplies and enclosures can be reduced. For indoor use, Power over Ethernet (PoE) is another highly desirable technology that minimizes installation cost. Recent advances in adaptive, closed-loop RF linearization have made it possible to economically linearize RF power amplifiers, including power amplifiers that are Class A, Class AB or Doherty, even at the low power levels used in small cells. To linearize a power amplifier, a linearization circuit conditions the input signal by combining it with a pre-distortion signal, such that the output of the power amplifier bears a substantially linear relationship to the input signal.

SUMMARY

According to one embodiment of the present invention, a dual power amplifier RF linearizer with cross-coupling cancelling technique is provided in conjunction with two concurrently operating power amplifiers. The present invention reduces excessive duplexer size, weight and cost. In addition, the present invention increases transmitter efficiency and receiver sensitivity by achieving lower duplexer insertion loss.

According to one embodiment of the present invention, a circuit in a transmitter with multiple power amplifiers includes multiple individual linearizer circuits each receiving a corresponding input signal and each providing a conditioned input signal to a corresponding power amplifier. The linearizer circuit each include: (a) a pre-distortion circuit receiving (i) the corresponding input signal and (ii) the output signal of a corresponding power amplifier, and providing a pre-distortion signal; (b) a cancelation circuit receiving an interfering signal and providing a cancelation signal; and (c) a combination circuit that combines the cancelation signal and the pre-distortion signal to provide a conditioned input signal to the corresponding power amplifier. The pre-distortion signal may be implemented as a polynomial function of the corresponding input signal, and the pre-distortion circuit may be adapted according to a cost function that minimizes out-of-band signal emission. The interfering signal in each linearizer circuit may be representative of a leakage signal from another linearizer circuit, and may be tapped from an appropriate signal in the other linearizer circuit. In one implementation, the interfering signal in each linearizer circuit may be a signal representative of a corresponding input signal, a corresponding pre-distortion signal, or a conditioned input signal to a corresponding power amplifier of the other linearizer circuit. Alternatively, the interfering signal in each linearizer circuit may include a signal representative of the output signal of the corresponding power amplifier.

According to one embodiment of the present invention, a cancelation circuit may include a vector modulator. In one implementation, the vector modulation includes (a) a quadrature phase shift circuit that provides in-phase and quadrature signals from an input signal; and (b) first and second multiplier circuits that scale, respectively, the in-phase and quadrature signals of the quadrature phase shift circuit according to first and second input values. The first and second input values may be provided in digital form. In that instance, digital-to-analog converters (DACs) may be provided to convert the input values to analog form.

The present invention is better understood upon consideration of the detailed description below in conjunction with the accompanying drawings.

BRIEF DESCRIPTION OF THE DRAWINGS

Like elements in the figures are assigned like reference numerals.

DETAILED DESCRIPTION OF THE PREFERRED EMBODIMENTS

The present invention is applicable to a transmitter having multiple power amplifiers for transmitting over multiple antennas simultaneously under a multiple-input-multiple-output (MIMO) configuration. In this detailed description, to allow the relevant concepts to be explained in a simple manner, examples using two-path configurations (i.e., configurations each having two MIMO data streams) are provided herein to illustrate the present invention. However, the present invention is not limited by these two-path configurations. In fact, the present invention is applicable to any transmitter having any number of MIMO data streams. The two-path transmitters illustrated herein each include two linearization or driver paths, designated paths A and B, respectively. To facilitate a description unencumbered by insignificant details, unless otherwise specified, path A and path B are described herein as being identically constructed. Thus, to avoid being excessively repetitious, where appropriate, only path A is described. Since many small cells are based on MIMO LTE or require support of multiple frequency bands, dual-path linearizer systems may provide both a low-power implementation and a desired small form factor.

Figure 1:
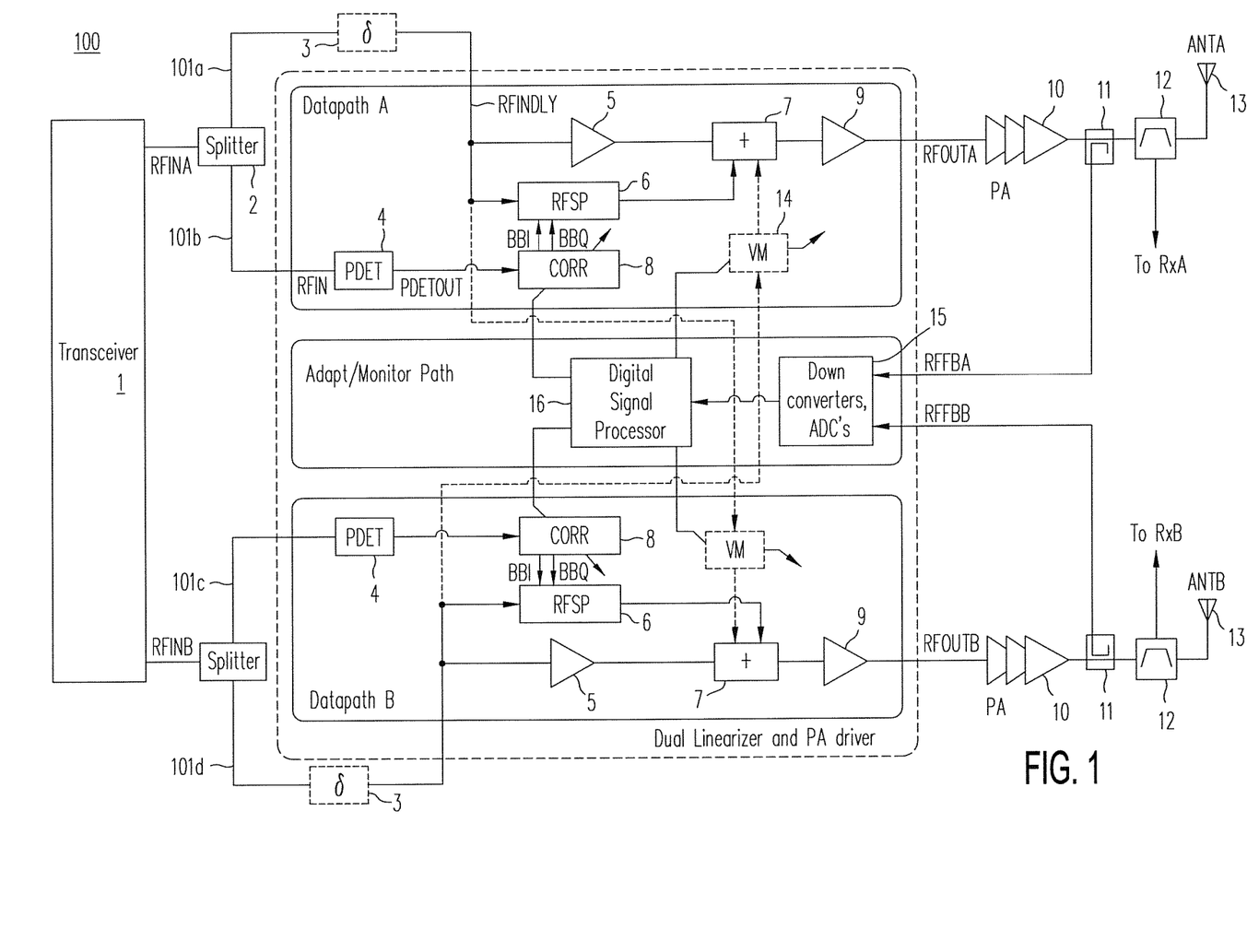
FIG. 1 shows transmitter 100 having output linearization paths A and B (labeled "Datapath A" and "Datapath B" in FIG. 1), in accordance with one embodiment of the invention.

FIG. 1 shows transmitter 100 having output linearization paths A and B (labeled "Datapath A" and "Datapath B" in FIG. 1, respectively), in accordance with one embodiment of the invention. As shown in FIG. 1, transceiver 1 provides RF input signals RFINA and RFINB to linearization paths A and B. Each RF input signal represents a baseband signal that is up-converted in transceiver 1 to a carrier frequency. In linearization path A, input RF signal RFINA is split by radio frequency (RF) power splitter 2 into signal paths 101a and 101b, which feed instantaneous power detector 4 and RF delay element 3, respectively. RF delay element 3, which accurately synchronizes a carrier signal and the predistortion signal to achieve optimal linearization performance, is not strictly required. Hence, for weakly non-linear power amplifiers (PA), e.g., low power class AB or class A PA's, RF delay element 3 may be omitted. The output signal of RF delay element 3 is provided to RF buffer 5 and RF signal processor (RFSP) 6. RFSP 6 provides a pre-distortion signal.

Figure 2:
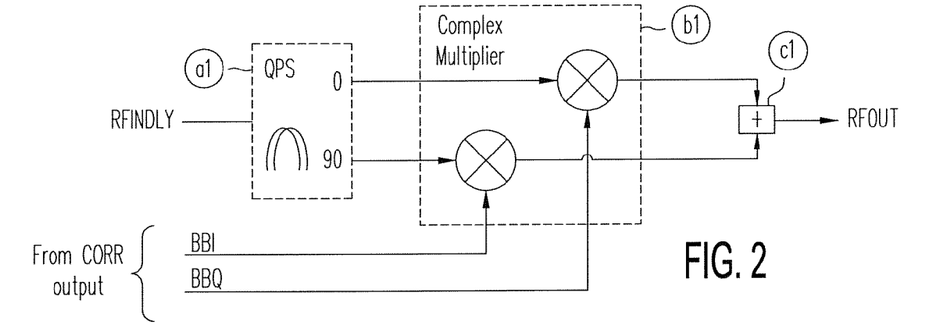
FIG. 2 shows an implementation of RF signal processor (RFSP) 6 of FIG. 1, according to one embodiment of the present invention.

FIG. 2 shows an implementation of RFSP 6, according to one embodiment of the present invention. As shown in FIG. 2, RFSP 6 includes quadrature phase shifter (QPS) a1 which generates, with substantially equal amplitudes, in-phase and quadrature phase-shifted (i.e., 90°) output signals of its input signal. In RFSP 6 of FIG. 1, this input signal is the delayed RF input signal from RF delay element 3. The quadrature output signals of QPS a1 are provided as a first set of input signals to full-quadrant complex multiplier b1, which also receives as a second set of input signals baseband signals BBI and BBQ. The products of the first and second sets of input signals are summed at summer c1. In RFSP 6 of FIG. 1, the summed signal at summer c1 is the pre-distortion signal. Therefore, in effect, baseband input signals BBI and BBQ modulate the incoming RF input signal.

Figure 3:
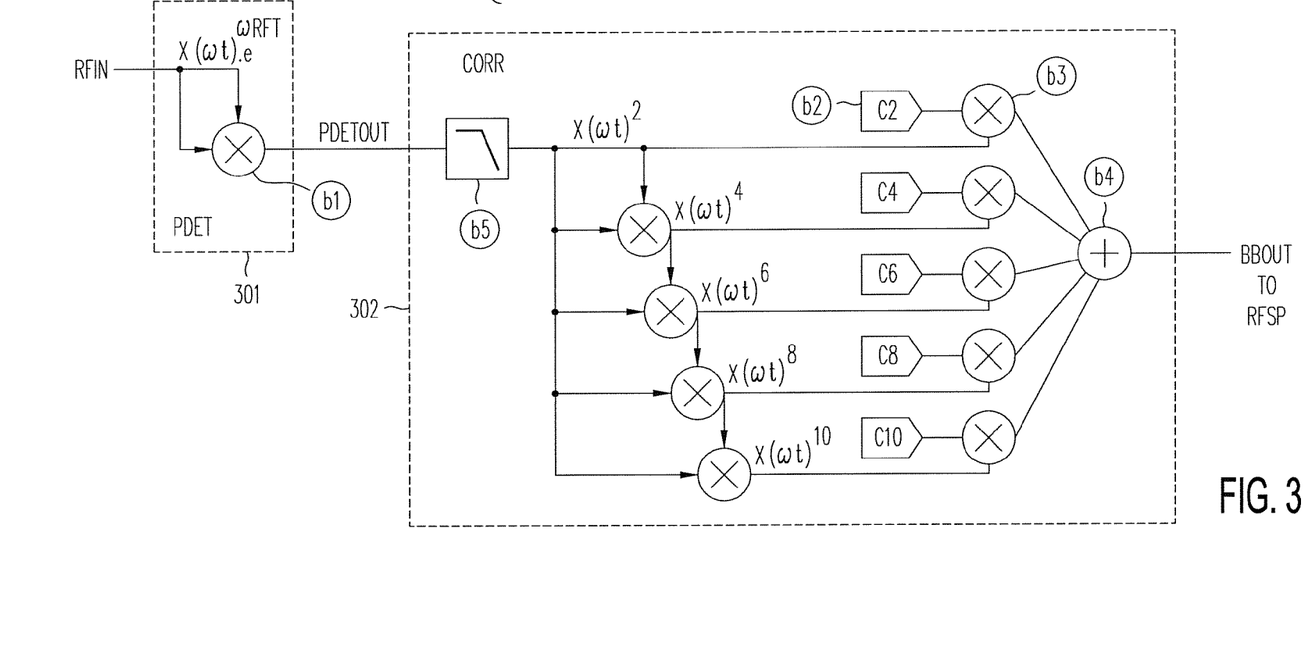
FIG. 3 shows an implementation of instantaneously power detector (PDET) 4 and correction (CORR) block 8 of FIG. 1, according to one embodiment of the present invention.

The pre-distortion signal is a polynomial function of the input signal. In signal path 101b, instantaneous power detector (PDET) 4 provides an instantaneous power envelope of the input signal to correction (CORR) circuit 8. CORR circuit 8 creates a memory polynomial expansion of the baseband portion of the instantaneous power envelope signal. This polynomial expansion is used to modulate the delayed incoming RF signal (from RF delay element 3) at RFSP 6 to create the pre-distortion signal. FIG. 3 shows an implementation of PDET 4 and CORR block 8, according to one embodiment of the present invention. As shown in FIG. 3, power detector (PDET) 4 includes RF squarer 301 that computes a squaring function of the input signal. The squared input signal is then provided to CORR circuit 8, which is implemented by circuit 302 of FIG. 3. RF squarer 301 is a multiplier b1 configured to provide the square of the envelope of its input signal (i.e., a square of instantaneous input signal $X(\omega t) e^{-j\omega_{RF}t}$, or $X(\omega t)^2$).

RF squarer 301 may be implemented, for example, by the RF squarer disclosed in U.S. Pat. No. 7,902,901 to Roger, issued on Mar. 8, 2011. Low-pass filter b5 of circuit 302 eliminates the RF content (i.e., the carrier signal) and retains the baseband content of the squared input signal envelope (i.e. $X(\omega t)^2$) at twice the baseband signal bandwidth. Circuit 302 includes multipliers b6 that create higher powers of the baseband signal envelope, and multipliers b3 that multiplies coefficient set b2 to the powers of the baseband signal envelope. Circuit 302 therefore generates a normalized polynomial function of the baseband signal envelope, which modulates the delayed input RF signal in RESP 6 to create the pre-distortion signal.

The pre-distortion signal of RFSP 6 is combined at summer 7 with the buffered, delayed RF input signal of RF buffer 5 to provide a pre-distorted output signal, which is then amplified by PA driver 9. PA driver 9 provides suitable impedance at the input terminal of PA 10. The output signal of PA 10 is sampled by coupling element 11 to quadrature down-converter and analog-to-digital converters (ADCs) 15, which provide a digital output signal that represents the baseband portion of the output signal of PA 10. This digital signal is converted from a time domain representation to a frequency domain representation using, for example, a fast fourier transform (FFT). Any non-zero component of the FFT that appear in a frequency bin outside of bandwidth of the baseband input signal is treated as a distortion to be reduced by linearization. Digital signal processor 16 minimizes these distortion frequency bins in a cost function that drives the adaptation of the polynomial coefficients of CORR circuit 8 (e.g., the coefficients set b2 of circuit 302 of FIG. 3).

Figure 4:
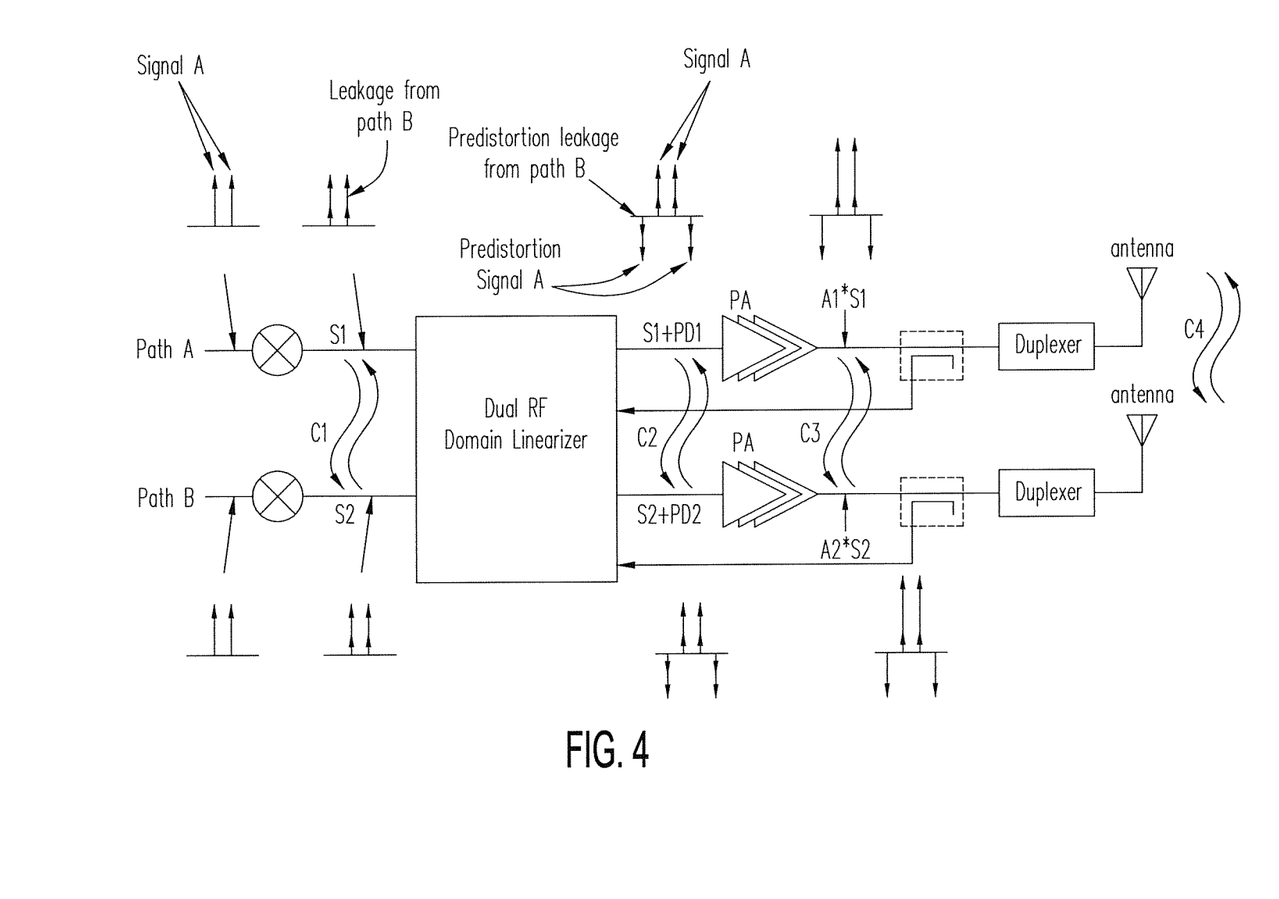
FIG. 4 illustrates the various locations along linearization paths A and B at which coupling between the linearization paths may occur.

According to one embodiment of the present invention, cross-cancellation circuit 14 is provided in each of linearization paths A and B to cancel interfering signals, such as any undesired signal coupling between the linearization paths. Coupling between linearization paths A and B may take place at any of multiple points in the linearization paths. FIG. 4 illustrates the various points along linearization paths A and B at which coupling may occur. First, coupling can take place at the up-converters (indicated by reference numeral C1 in FIG. 4) prior to the RF input signals entering linearization paths A and B. As coupling at C1 occurs prior to signal processing in linearization paths A and B, the coupling represents leakage of the input signal at linearization path A into linearization path B, and vice-versa, involving only signals within the baseband bandwidth of the RF input signals.

As shown in FIG. 4, coupling may also take place at the output terminals of linearization paths A and B (as indicated by reference numeral C2 of FIG. 4), such as at summer 7 of FIG. 1, where the combined delayed RF input signal and the pre-distortion signal in one linearization path may be leaked to the other linearization path. As a result of signal processing in the linearization path, signal leakage may involve frequencies outside of the bandwidth of the baseband signal.

Coupling may also occur at the output terminals of the PAs (as indicated by reference numeral C3 of FIG. 4). At point C3, out-of-band distortions are typically low, as the linearization in each linearization path cancels such distortions. However, in each linearization path, if coupling at point C2 has not been canceled, signal and pre-distortion signal leakage from the other linearization path remains.

Finally, coupling at the antennae may also occur (as indicated by reference numeral C4 in FIG. 4). Coupling at the antennae is in effect similar to coupling at point C3 (i.e., the output terminals of the PAs).

Figure 5:
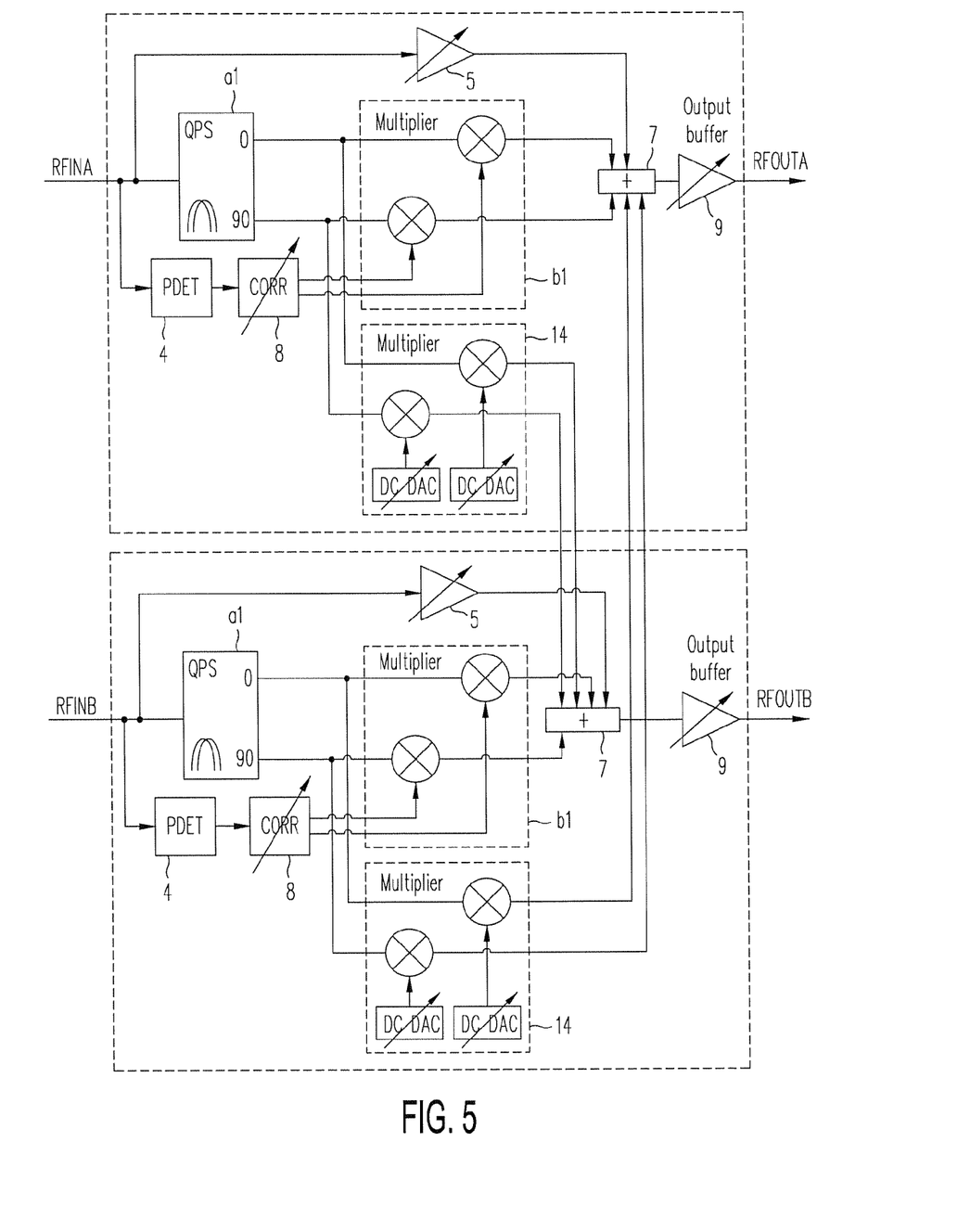
FIG. 5 shows one implementation of signal cross-canceller 14, provided to cancel input signal coupling effects C1, C3 and C4 in each linearization path, in accordance with one embodiment of the present invention.

FIG. 5 shows one implementation of signal cross-canceller 14, provided to cancel signal coupling effects C1, C3 and C4 in each linearization path, in accordance with one embodiment of the present invention. As shown in FIG. 5, a cross-path signal leakage is cancelled in summer 7 (i.e., prior to amplification by PA driver 9) in one linearization path, based on the output quadrature signals at QPS a1 of RFSP 6 in the other linearization path. (In fact, as illustrated in FIG. 7, signal cross-cancellation can be applied in like manner for leakage from any point observed). Cross-path signal leakage cancellation may be achieved by in a linearization path by combining its output signal with a signal that has the same amplitude and which is shifted by 180° as the leakage signal from the other linearization path. Signal combination may be achieved, for example, by RF vector modulator 600 of FIG. 6, in accordance with one embodiment of the present invention. Signal coupling C1, C3 and C4 may have significant different phases and multiple cancellers may be used in parallel to the ones shown in FIG. 5.

Figure 6:
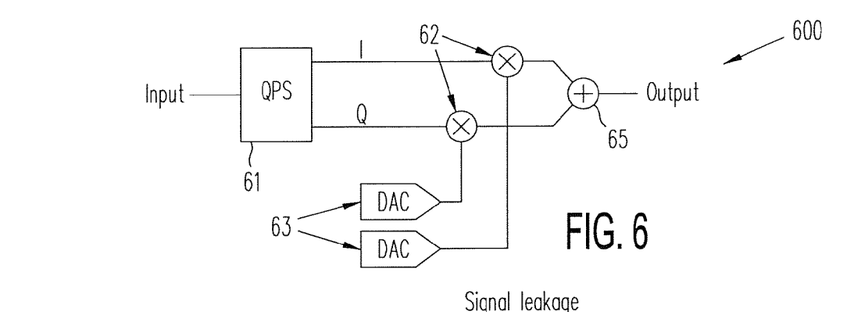
FIG. 6 shows RF vector modulator 600, provided for canceling a cross-path signal leakage, in accordance with one embodiment of the present invention.
Figure 7:
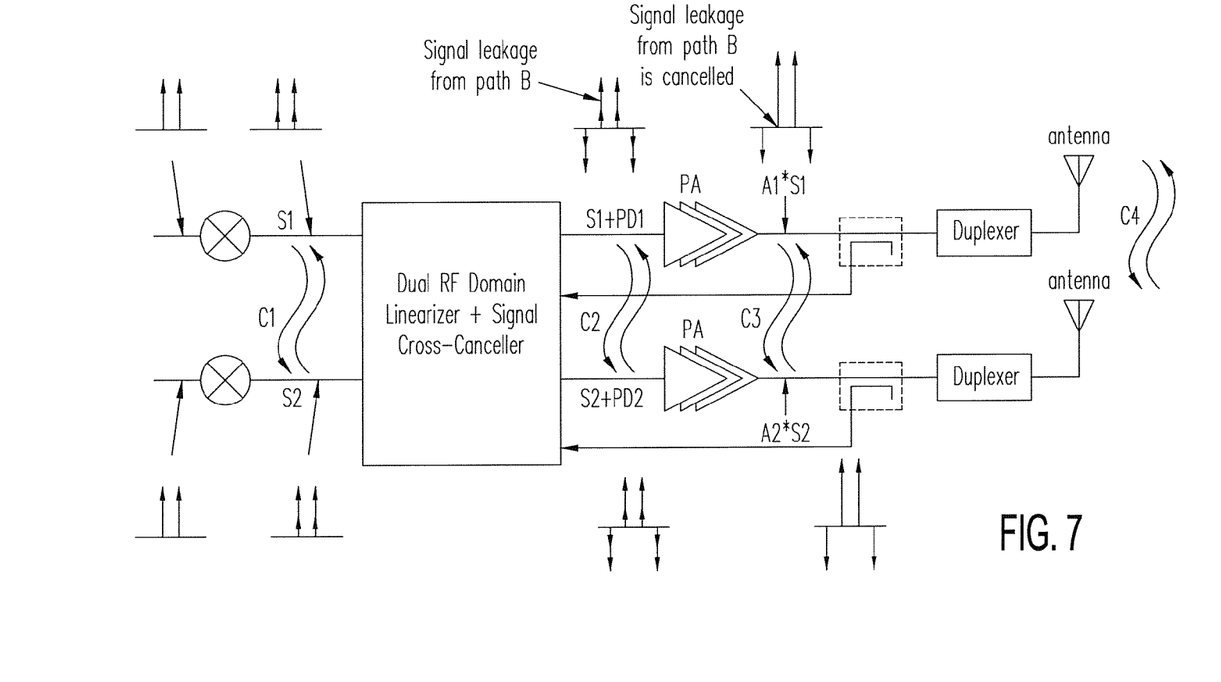
FIG. 7 illustrates that the signal cross-cancellation by the implementation of FIG. 5 applies only to coupling between the input signals and does not apply to the signal coupling between the predistortion signals.
Figure 8:
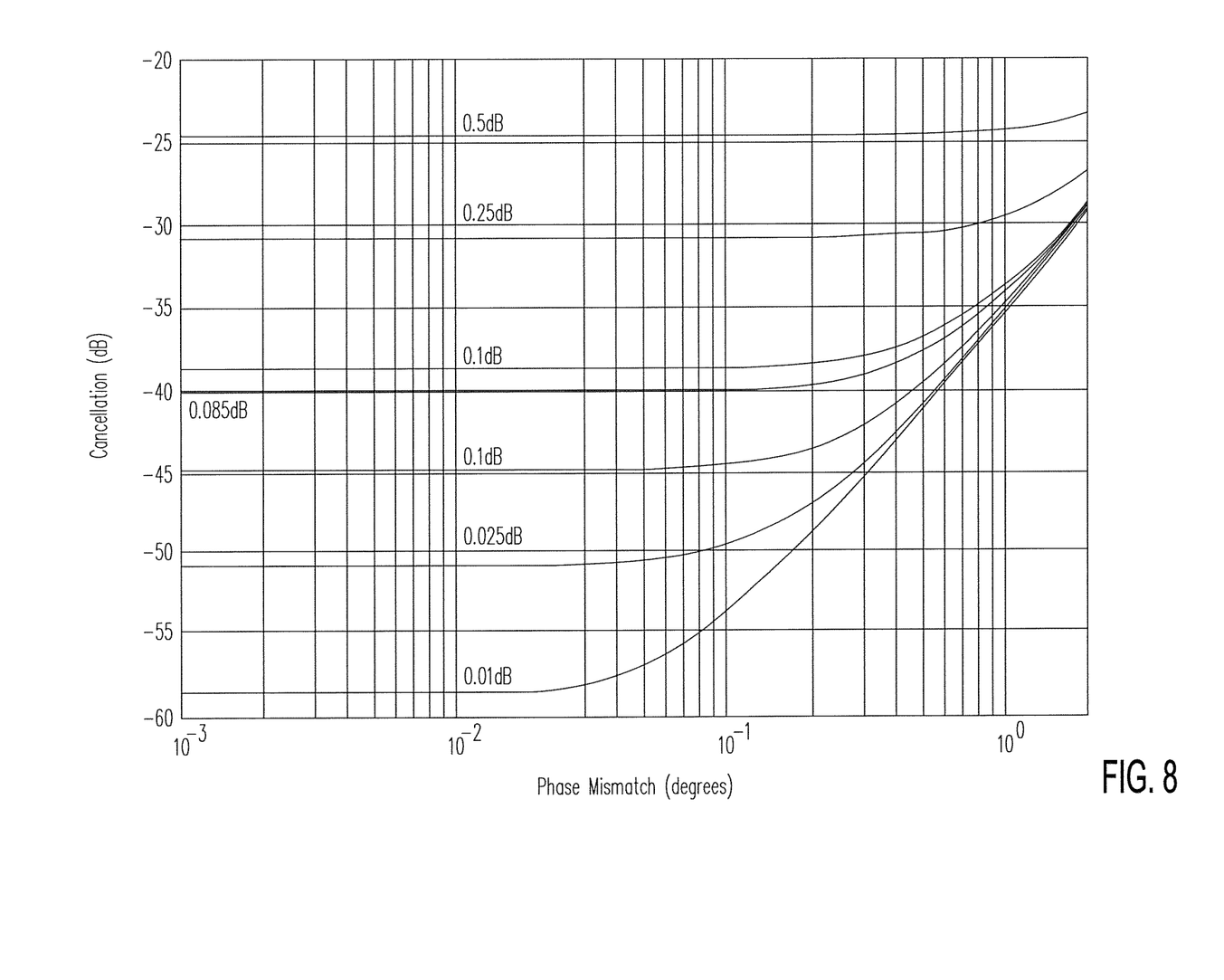
FIG. 8 shows the achievable cancellation levels as a function of phase mismatch and various values of gain mismatch.

As shown in FIG. 6, RF vector modulator 600 modifies both the gain and the phase of an incoming RF signal by scaling the in-phase and quadrature components of the RF incoming signal at analog multipliers 62 by the values specified at input terminals of digital-to-analog converters (DACs) 63. As shown in FIG. 6, in QPS 61, the incoming RF input signal is split into in-phase and quadrature signals, which are then scaled at full-quadrant multipliers 62 and summed at summer 65. The values at the input terminals of DACs 63 specify the desired phase and amplitude to scale. Cancellation performance in vector modulator 600 is limited by the gain and phase mismatches (due to, for example, DAC resolution, gain or phase frequency flatness) and any delay mismatch. FIG. 8 shows the achievable cancellation levels as a function of phase mismatch and various values of gain mismatch.

Figure 9:
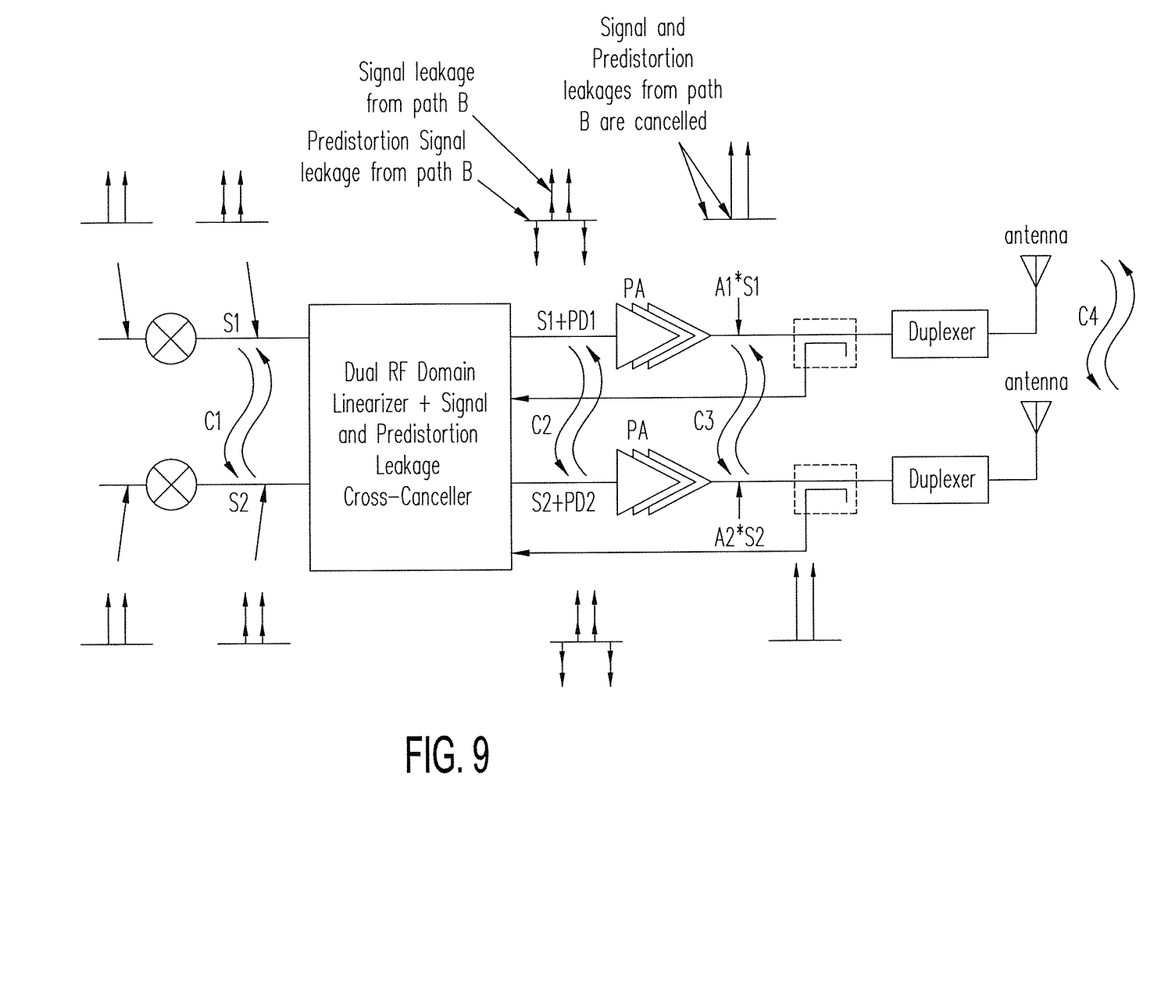
FIG. 9 shows signal and pre-distortion cross-cancellation (e.g., when the circuits of FIGS. 5 and 10 are combined).
Figure 10:
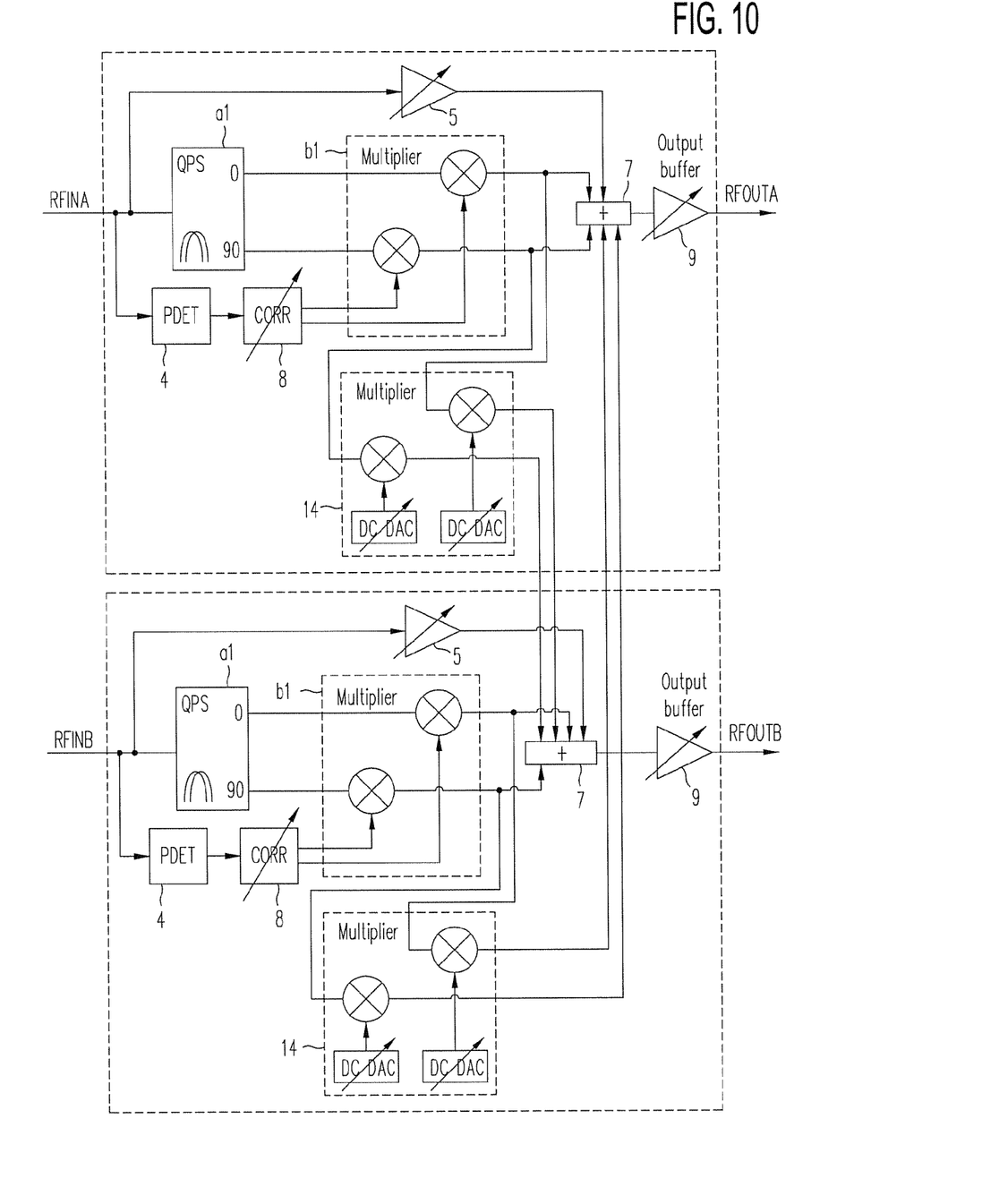
FIG. 10 shows cross-cancellation in each linearization path, based on the pre-distortion signal in the other linearization path, in accordance with one embodiment of the present invention.

Alternatively, pre-distortion signal leakage may be cancelled in each linearization path based on the output signals at full-quadrant multiplier b1 of RFSP 6 (i.e., including the pre-distortion signal) in the other linearization path, as illustrated in FIGS. 9 and 10.

Figure 11:
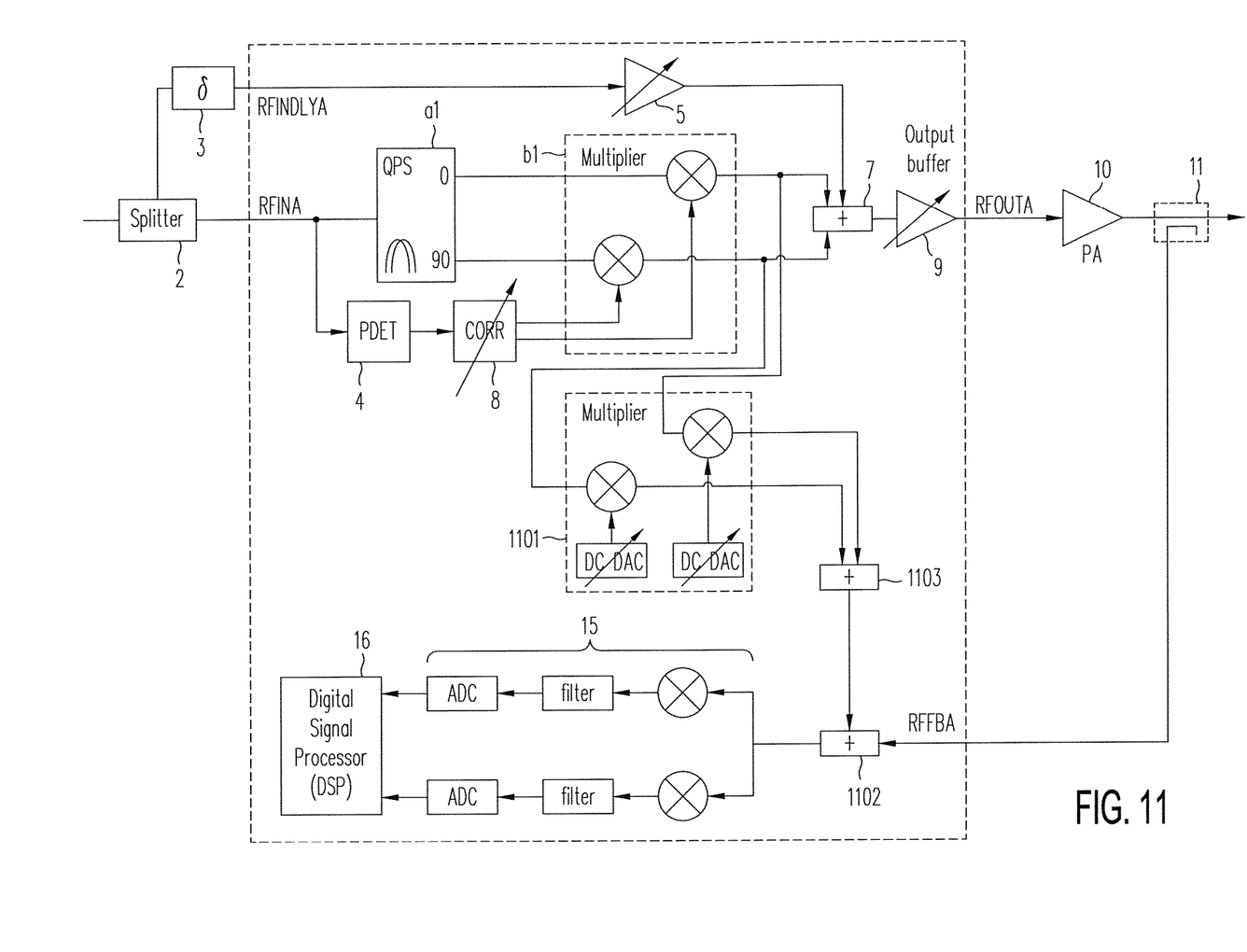
FIG. 11 shows another circuit configuration for canceling predistortion signal leakage, using the feedback signal (i.e., the output signal of the PA) from a monitor port, in accordance with one embodiment of the present invention.

FIG. 11 shows circuit configuration 1100 in each linearization path for canceling pre-distortion signal leakage, using the feedback signal (i.e., the output signal of the PA 10) from a monitor port (e.g., coupling element 11 of FIG. 1), in accordance with one embodiment of the present invention. As shown in FIG. 11, cancellation is achieved using vector modulator 1101 based on the output signals at full-quadrant multiplier b1 of RFSP 6. At combiners 1102 and 1103, the properly scaled cancellation signal is combined with the feedback signal. The resulting signal after cancellation is then provided to down-converters and ADCs 15 and DSP 16 for coefficient adaptation, as discussed above.

The above detailed description is provided to illustrate the specific embodiments of the present invention. Numerous variations and modifications within the scope of the present invention are possible. For example, various aspects of the present invention are illustrated by the circuits of FIGS. 1, 5, 10 and 11. The methods and circuitry embodied in these figures may be used within the scope of the present invention individually or in any combination. The present invention is set forth in the accompanying claims.

We claim:

1. A processing circuit for a first power amplifier and a second power amplifier, receiving a first input signal, a second input signal, an output signal of the first power amplifier and an output signal of the second power amplifier, comprising:
  a first linearizer circuit that receives the first input signal and the output signal of the first power amplifier; and
  a second linearizer circuit that receives the second input signal and the output signal of the second power amplifier, wherein the first linearizer circuit and the second linearizer circuit each comprises:
    a pre-distortion circuit receiving (i) a corresponding one of the first input signal and the second input signal and (ii) the output signal of a corresponding one of the first power amplifier and the second power amplifier, and providing a pre-distortion signal;
    a cancelation circuit receiving an interfering signal and providing a cancelation signal; and
    a combination circuit that combines the cancelation signal and the pre-distortion signal to provide a conditioned input signal to the corresponding one of the first power amplifier and the second power amplifier.

2. The processing circuit of claim 1, wherein the pre-distortion circuit comprises a circuit that implements a polynomial function of the corresponding input signal.

3. The processing circuit of claim 2, wherein coefficients of the polynomial function are adjusted adaptively according to the output signal of the corresponding power amplifier.

4. The processing circuit of claim 1, wherein the interfering signal in each linearizer circuit is representative of a leakage signal from the other linearizer circuit, and wherein the interfering signal is provided from the other linearizer circuit.

5. The processing circuit of claim 4, wherein the interfering signal in each linearizer circuit comprises a signal representative of the corresponding input signal of the other linearizer circuit.

6. The processing circuit of claim 4, wherein the interfering signal in each linearizer circuit comprises a signal representative of the corresponding pre-distortion signal of the other linearizer circuit.

7. The processing circuit of claim 4, wherein the interfering signal in each linearizer circuit comprises a signal representative of the corresponding conditioned input signal provided by the other linearizer circuit.

8. The processing circuit of claim 1, wherein the interfering signal in each linearizer circuit comprises a signal representative of the output signal of the corresponding power amplifier.

9. The processing circuit of claim 1, wherein the cancelation circuit comprises a vector modulator.

10. The processing circuit of claim 9, wherein the vector modulator comprises:
  a quadrature phase shift circuit that provides in-phase and quadrature signals from an input signal; and
  first and second multiplier circuits that scale, respectively, the in-phase and quadrature signals of the quadrature phase shift circuit according to first and second input values.

11. The processing circuit of claim 10, wherein the first and second input values are each provided in digital form, and wherein the first and second multiplier circuits each comprises a digital-to-analog converter for converting the corresponding one of the first and second input values to analog form.

* * * * *

UNITED STATES PATENT AND TRADEMARK OFFICE
CERTIFICATE OF CORRECTION

PATENT NO.         : 9,124,225 B2
APPLICATION NO.    : 14/192488
DATED              : September 1, 2015
INVENTOR(S)        : Olivier Charlon et al.

Page 1 of 1

It is certified that error appears in the above-identified patent and that said Letters Patent is hereby corrected as shown below:

In the Drawings:
Sheet 2 of 9, Reference

| | |
|---|---|
| Numeral 301, FIG. 3 | Delete "$X(\omega t) \cdot e^{\omega RFT}$" and insert -- $X(\omega t)e^{-j\omega_{RF}t}$ -- |
| Sheet 3 of 9, FIG. 4 | Delete "Predistortion" and insert --Pre-distortion-- |
| Sheet 3 of 9, FIG. 4 | Delete "Predistortion" and insert --Pre-distortion-- |
| Sheet 7 of 9, FIG. 9 | Delete "Predistortion" and insert --Pre-distortion-- |
| Sheet 7 of 9, FIG. 9 | Delete "Predistortion" and insert --Pre-distortion-- |
| Sheet 7 of 9, FIG. 9 | Delete "Predistortion" and insert --Pre-distortion-- |

In the Specification:

| | |
|---|---|
| Column 1, Line 10 | After "the", insert --Copending-- |
| Column 2, Line 45 | Delete "predistortion" and insert --pre-distortion-- |
| Column 2, Line 55 | Delete "predistortion" and insert --pre-distortion-- |
| Column 3, Line 29 | Delete "predistortion" and insert --pre-distortion-- |
| Column 4, Line 18 | Delete "PA10" and insert --PA 10-- |

Signed and Sealed this
Ninth Day of February, 2016

Michelle K. Lee
*Director of the United States Patent and Trademark Office*